ized on the top surface and sidewalls of the
United States Patent
Lee et al.

(12) United States Patent
(10) Patent No.: US 6,878,988 B1
(45) Date of Patent: Apr. 12, 2005

(54) NON-VOLATILE MEMORY WITH INDUCED BIT LINES

(75) Inventors: Tzyh-Cheang Lee, Hsin-Chu (TW);
Nai-Chen Peng, Hsin-Chu (TW);
Chungchin Shih, Hsin-Chu County (TW); Ching-Hung Cheng, Hsin-Chu (TW)

(73) Assignee: United Microelectronics Corp., Hsin-Chu (TW)

(*) Notice: Subject to any disclaimer, the term of this patent is extended or adjusted under 35 U.S.C. 154(b) by 0 days.

(21) Appl. No.: 10/709,854

(22) Filed: Jun. 2, 2004

(51) Int. Cl.[7] .......................................... H01L 29/792
(52) U.S. Cl. ...................... 257/324; 257/314; 257/288; 438/216; 438/261; 438/591; 438/593
(58) Field of Search ................................. 257/324, 314, 257/288; 438/FOR 431, 216, 261, 591, 593

(56) References Cited

U.S. PATENT DOCUMENTS 6,436,768 B1   8/2002   Yang et al. ................. 438/266

2003/0006450 A1 * 1/2003 Haspeslagh ................. 257/316

* cited by examiner

*Primary Examiner*—Nathan J. Flynn
*Assistant Examiner*—Scott R. Wilson
(74) *Attorney, Agent, or Firm*—Winston Hsu

(57) ABSTRACT

An electrically programmable non-volatile memory cell is provided. A semiconductor substrate is prepared. A pair of spaced apart source/drain (S/D) regions is defined on the semiconductor substrate. The spaced apart S/D regions define a channel region in between. A first dielectric layer such as silicon dioxide is disposed on the S/D regions. An assistant gate is stacked on the first dielectric layer. The assistant gate has a top surface and sidewalls. A second dielectric layer comprising a charge-trapping layer is uniformly disposed on the top surface and sidewalls of the assistant gate and is also disposed on the channel region. The second dielectric layer provides a recessed trough between the S/D regions. A conductive gate material fills the recessed trough for controlling said channel region.

9 Claims, 5 Drawing Sheets

NON-VOLATILE MEMORY WITH INDUCED BIT LINES

BACKGROUND OF INVENTION

1. Field of the Invention

The present invention relates generally to the field of electrically programmable non-volatile memory devices. More particularly, the present invention relates to an SONOS (MONOS) type non-volatile memory array using induced (polysilicon bit line induced) bit lines.

2. Description of the Prior Art

Nitride-based non-volatile memories such as Nitride Read-Only-Memory (NROM), Metal-Oxide-Nitride-Oxide-Silicon (MONOS) type or Silicon-Oxide-Nitride-Oxide-Silicon (SONOS) type non-volatile memory devices are known in the art. A nitride-based non-volatile memory cell is constructed having a non-conducting dielectric layer, typically a silicon nitride layer, sandwiched between two silicon dioxide layers. The non-conducting dielectric layer functions as an electrical charge-trapping medium. A conductive gate layer is placed over the upper silicon dioxide layer. Buried doping regions or buried bit lines are implanted into the substrate, which function as a buried drain or buried source for a selected memory cell depending on the desired operation conditions. Since the electrical charge is trapped and localized near whichever side that is used as the buried drain, this structure can be described as a two-transistor cell, or two-bit per cell (i.e., two physically separated storage areas per cell).

FIG. 1 schematically illustrates an enlarged cross-sectional view of a typical two-bit SONOS type memory cell 100. Generally, SONOS type memory cell 100 is programmed by injecting hot electron from a portion of the substrate 10, such as the channel section near the buried drain region, to the charge-trapping medium 24. Electron injection causes the accumulation of negative charge in the charge-trapping medium 24 that is sandwiched between the bottom oxide layer 22 and the top oxide layer 26. The injection mechanism can be induced by grounding the buried source region and a bulk portion of the substrate 10 and applying a relatively high positive voltage to the control electrode 30 to create an electron attracting field and applying a positive voltage of moderate magnitude to the buried drain region in order to generate hot electrons. After sufficient negative charge accumulates on the charge-trapping medium, the negative potential of the charge-trapping medium raises the threshold voltage of its field effect transistor (FET) and inhibits current flow through the channel region through a subsequent read mode. The magnitude of the read current is used to determine whether or not a SONOS type memory cell is programmed.

Conventionally, the buried bit lines 40 of the SONOS (MONOS) type memory are formed by implanting impurities into the substrate through a bit line mask prior to forming the ONO dielectric. Ordinarily, in order to reduce the buried bit line sheet resistance, a high-dosage ion implantation process is used. This is disadvantageous when the wafer is subjected to subsequent high temperature thermal cycles, because the doping impurities within the buried bit line regions tend to diffuse outwards, thereby laterally expanding the buried bit line regions towards one another, thus causing punch-through to take place between adjacent buried bit lines. From one aspect, the punch-through problem also hinders the cell shrinkage of such type of memories since adequate channel length has to be maintained.

To mitigate the excessive diffusion of the ion-implanted buried bit lines, Yang et al., in U.S. Pat. No. 6,436,768, teach a method of fabricating the source/drain regions of SONOS type non-volatile memory semiconductor devices. According to this patent, the source/drain implantation is carried out during ONO formation.

SUMMARY OF INVENTION

It is the primary object of the present invention to provide an electrically programmable non-volatile memory using induced bit lines, thereby solving the above-mentioned problems.

It is another object of the present invention to provide an electrically programmable non-volatile memory device having no physically ion-implanted bit lines.

According to the claimed invention, an electrically programmable non-volatile memory cell is provided. A semiconductor substrate of first conductivity type is prepared. A pair of spaced apart source/drain (S/D) regions is defined on the semiconductor substrate. The spaced apart source/drain (S/D) regions define a channel region in between. A first dielectric layer such as silicon dioxide is disposed on the source/drain (S/D) regions. An assistant gate is stacked on the first dielectric layer. The assistant gate has a top surface and sidewalls. A second dielectric layer comprising a charge-trapping layer is uniformly disposed on the top surface and sidewalls of the assistant gate and is also disposed on the channel region. The second dielectric layer provides a recessed trough between the source/drain (S/D) regions. A conductive gate material fills the recessed trough for controlling said channel region.

In operation, the assistant gate is biased to a voltage $V_i$ that is sufficient to induce a corresponding inversion region of second conductivity type in the semiconductor substrate. The inversion region of second conductivity type acts as a source/drain of the electrically programmable non-volatile memory cell according to this invention.

Other objects, advantages and novel features of the invention will become more clearly and readily apparent from the following detailed description when taken in conjunction with the accompanying drawings.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

The present invention pertains to a novel electrically programmable non-volatile memory device or electrically erasable programmable non-volatile memory device. A typical ion implantation for forming buried bit lines prior to or during the formation of the charge-trapping medium such as ONO dielectric is eliminated. That is, the present invention electrically programmable non-volatile memory device has no physically ion-implanted buried bit lines in the memory array. Instead, a polysilicon bit line pattern is formed on the semiconductor for inducing source/drain inversion regions during operation.

Figure 1:
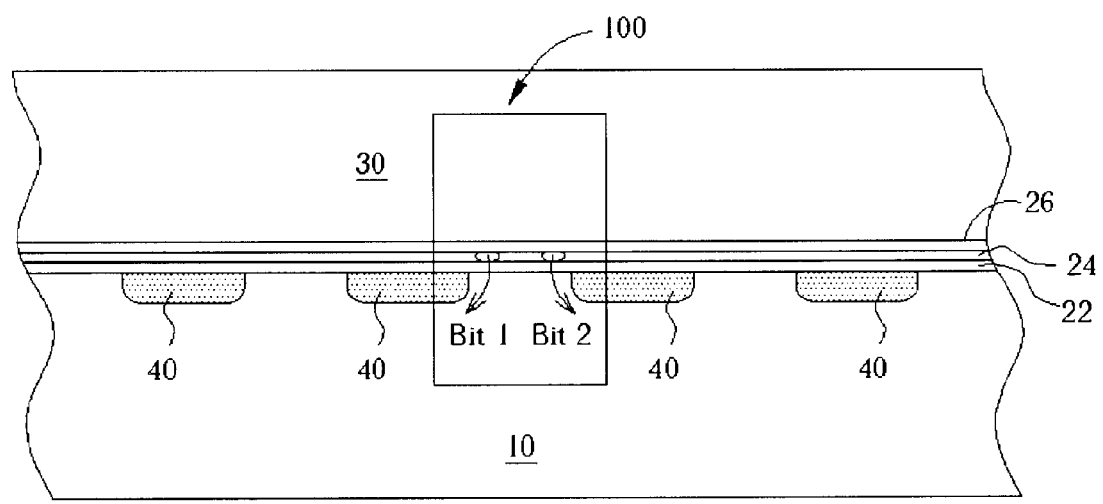
FIG. 1 is a schematic, cross-sectional diagram illustrating a two-bit SONOS memory cell according to the prior art.
Figure 2:
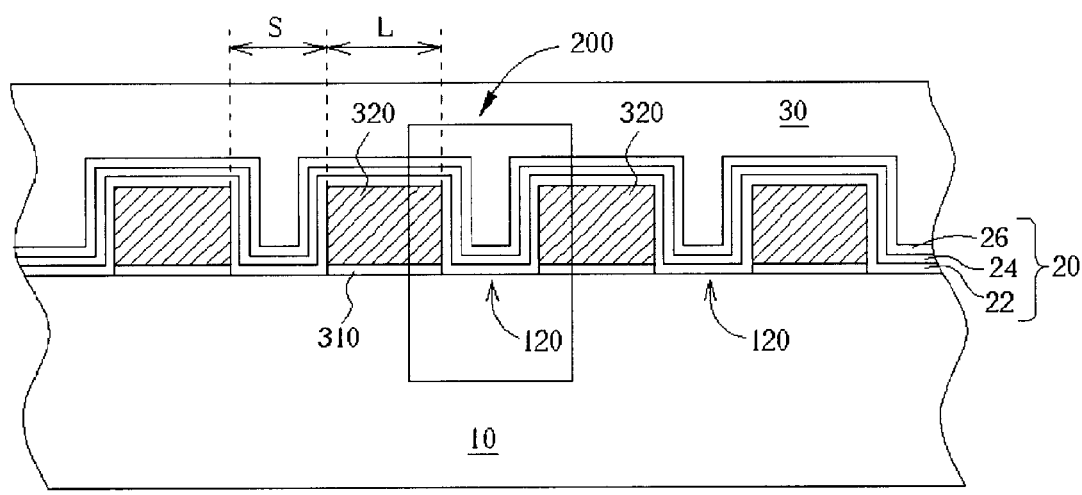
FIG. 2 is a schematic cross-sectional diagram illustrating a SONOS type electrically programmable non-volatile memory cell in accordance with the preferred embodiment of the present invention.

Please refer to FIG. 2. FIG. 2 is a schematic cross-sectional diagram illustrating a SONOS type electrically programmable non-volatile memory cell 200 in accordance with the preferred embodiment of the present invention, wherein like numerals designate similar regions, elements, or layers. As shown in FIG. 2, a substrate 10 of first conductivity type such as P type substrate is prepared. The substrate 10 has a main surface on which memory array and memory cells are fabricated. It is appreciated by those skilled in the art that the numeral 10 may alternatively indicate a cell ion well such as a P well that is doped in a bulk silicon substrate. Further, it is to be understood that only a segment of the memory array that is germane to the present invention is illustrated in this figure. A number of columns of doped polysilicon lines or assistant gates (AG) 320 are laid on the substrate 10. Each of the doped polysilicon lines 320 has a top surface and vertical sidewalls.

A thin dielectric layer 310 is interposed between each assistant gate 320 and the substrate 10. Preferably, the thin dielectric layer 310 is a silicon dioxide layer that is thermally grown on the main surface simultaneously with the formation of gate oxide layer in the core circuit of the memory device. The thin dielectric layer 310 may has a thickness of about 30~120 angstroms, but not limited thereto. A channel region 120 is defined in the substrate 10 between two adjacent assistant gates 320. A composite dielectric layer 20 is formed on the top surface and sidewalls of the columns of assistant gates 320 and on the channel regions 120. A number of rows of polysilicon word lines 30 are laid on the composite dielectric layer 20. In another case, the polysilicon word lines 30 may be replaced with other conductive materials such as metals.

The composite dielectric layer 20 may be any dielectric layer or layers that are capable of or facilitate electron trapping. In other words, to facilitate electron trapping, the charge trapping dielectric has a layer with a lower barrier height than the layers sandwiching it (two layers with relatively higher barrier heights sandwiching a layer with a relatively lower barrier height). Preferably, in accordance with the preferred embodiment of the present invention, the composite dielectric layer 20 is an ONO trilayer dielectric including a bottom oxide layer 22, a middle nitride layer 24, and a top oxide layer 26. Other examples of the composite dielectric layer 20 include an oxide/nitride bi-layer dielectric, a nitride/oxide bilayer dielectric, an oxide/tantalum oxide bilayer dielectric ($SiO_2/Ta_2O_5$), an oxide/tantalum oxide/oxide trilayer dielectric ($SiO_2/Ta_2O_5/SiO_2$), an oxide/strontium titanate bilayer dielectric ($SiO_2/SrTiO_3$), an oxide/barium strontium titanate bilayer dielectric ($SiO_2/BaSrTiO_2$), an oxide/strontium titanate/oxide trilayer dielectric ($SiO_2/SrTiO_3/SiO_2$), an oxide/strontium titanate/barium strontium titanate trilayer dielectric ($SiO_2/SrTiO_3/BaSrTiO_2$), an oxide/hafnium oxide/oxide trilayer dielectric ($SiO_2/Hf_2O_5/SiO_2$), and the like (in each case, the first layer mentioned is the bottom layer while the last layer mentioned is the top layer).

As specifically indicated in FIG. 2, each of the assistant gates 320 has a line width "L" that is approximately the critical dimension (CD) of the lithographic method that is used to fabricate the memory device of the present invention. Preferably, the inter-spacing "S" between two adjacent assistant gates 320 is also minimized to the CD (critical dimension). By doing this, a maximum packing density of the memory cells, each of which has a $4F^2$ memory unit size, may be achieved, wherein "2F" is the combination of "L" and "S". It is noteworthy that the memory array of the present invention has no ion-implanted buried bit lines formed in the substrate 10. Moreover, the composite dielectric layer 20 does not fill the inter-spacing between two adjacent assistant gates 320. A recessed trough is produced between two adjacent assistant gates 320 after forming the composite dielectric layer 20, such that the polysilicon word line 30 may well control the channel region 120.

Although the term SONOS type nonvolatile memory device is often used herein, it is to be understood that a SONOS type nonvolatile memory device as cited herein may contain any of the charge-trapping dielectrics described above. In other words, a SONOS type nonvolatile memory device contains any dielectric layer or layers that are capable of or facilitate electron trapping, and the SONOS type nonvolatile memory device contains an ONO charge trapping dielectric only when a specific reference to such dielectric is indicated.

Figure 3:
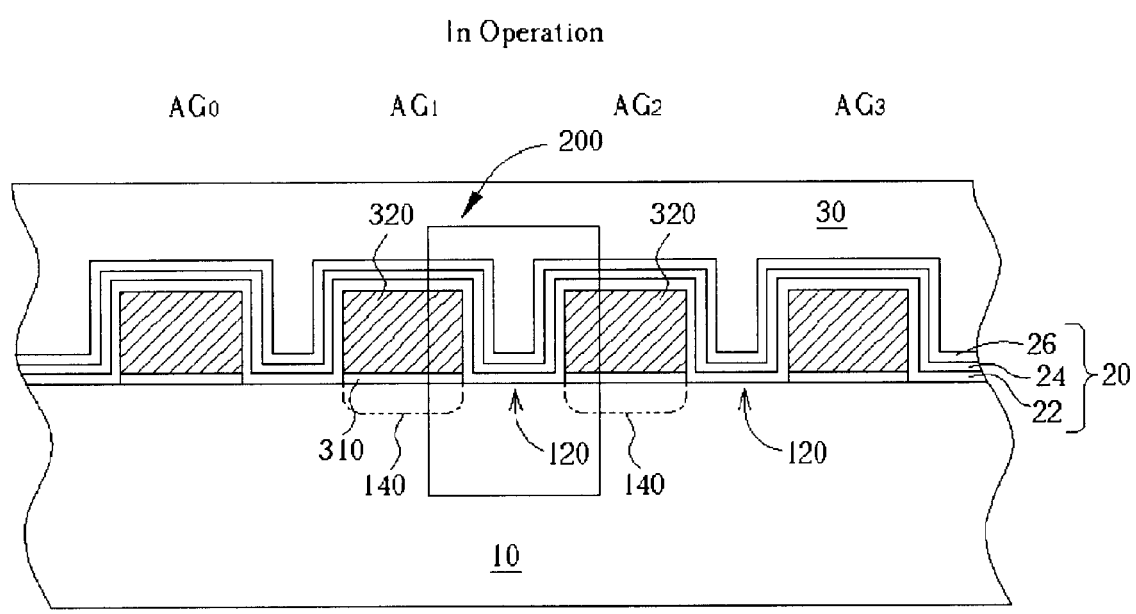
FIG. 3 is a schematic cross-sectional diagram illustrating the SONOS type electrically programmable non-volatile memory cell of FIG. 2 when in operation, in accordance with the preferred embodiment of the present invention.
Figure 4:
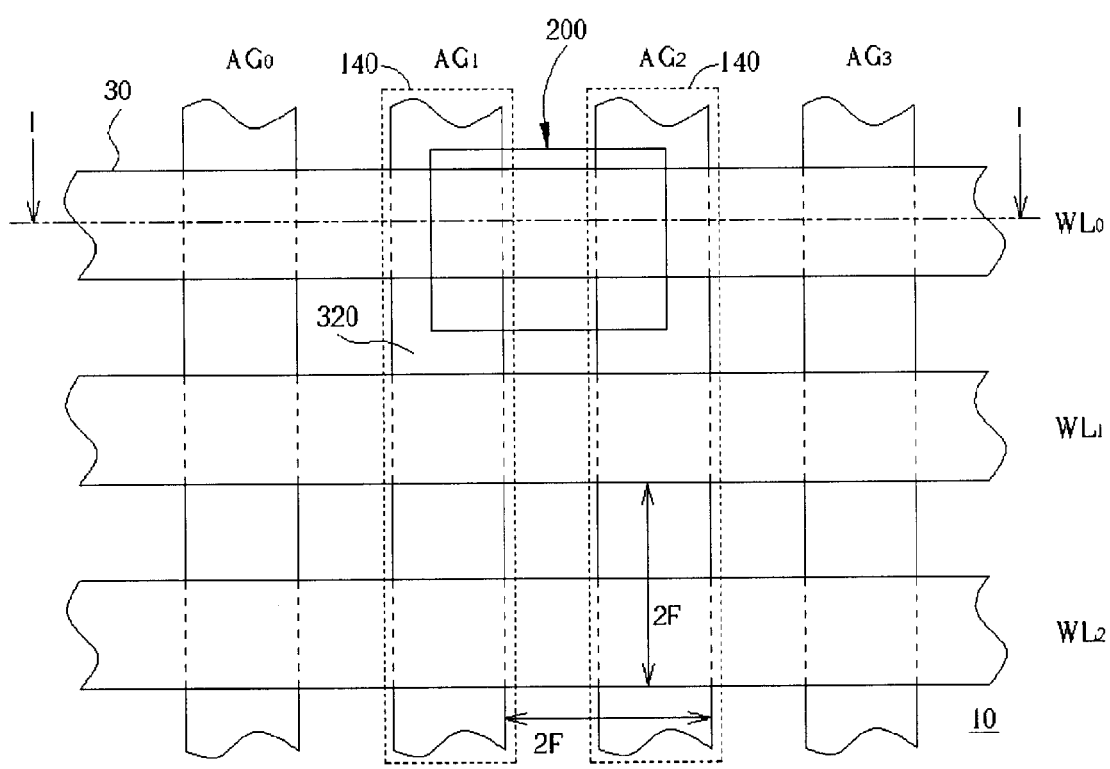
FIG. 4 is a plan view of a portion of the memory array according to the present invention, wherein the cross-sectional view of FIG. 3 is seen along line I—I.
Figure 5:
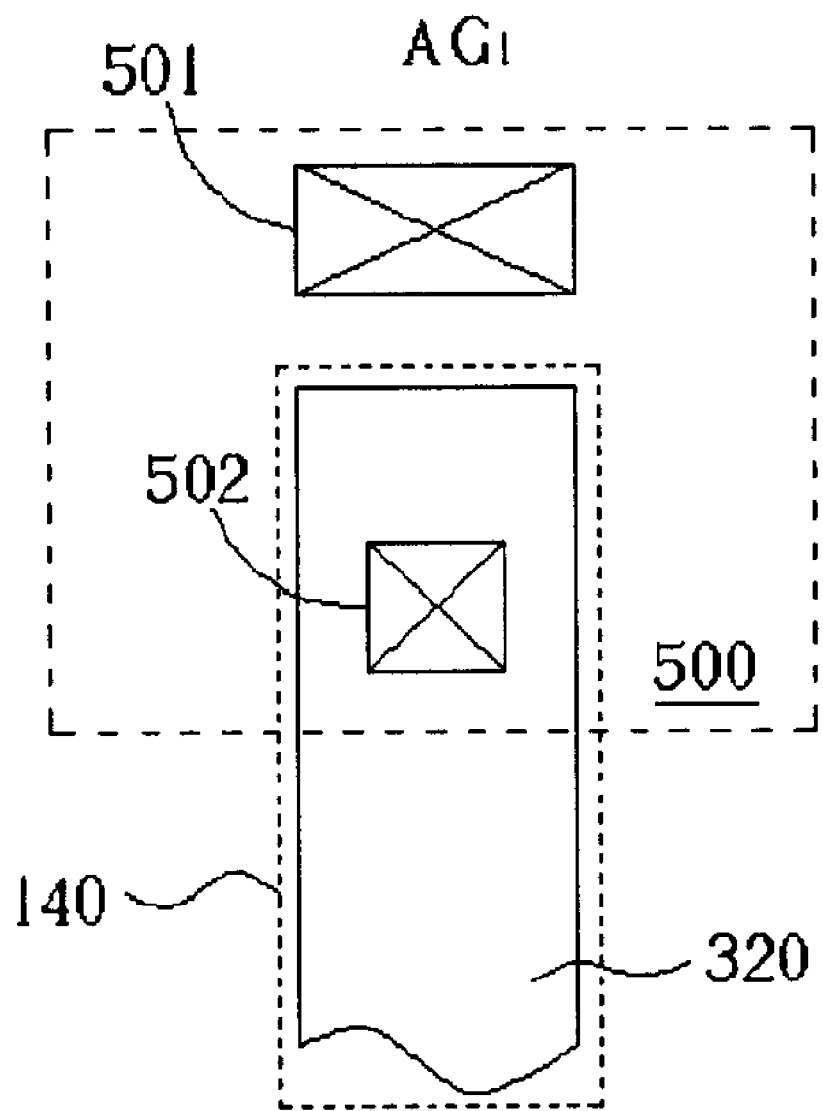
FIG. 5 is an exemplary top view showing the layout of a pickup well and bit line contact structure disposed at one end of the assistant gate $AG_1$ according to the present invention.

Please refer to FIG. 3 and FIG. 4. FIG. 3 is a schematic cross-sectional diagram illustrating the SONOS type electrically programmable non-volatile memory cell 200 of FIG. 2 when in operation, in accordance with the preferred embodiment of the present invention. FIG. 4 is a plan view of a portion of the memory array according to the present invention. The cross-sectional view of FIG. 3 is seen along line I—I of FIG. 4 and the memory cell 200 of FIG. 3 is also indicated in FIG. 4. As shown in FIG. 3 and FIG. 4, a plurality of assistant gates 320 specifically denoted as, for example, $AG_0$, $AG_1$, $AG_2$, and $AG_3$ are provided in columns. At least one end of each of the assistant gates 320 partially overlaps with a heavily doped pickup well 500 formed in the substrate 10, as shown in FIG. 5. A plurality of word lines 30 specifically denoted as, for example, $WL_0$, $WL_1$, and $WL_2$ are defined in rows over the columns of assistant gates $AG_0$, $AG_1$, $AG_2$, and $AG_3$.

When operating the memory cell 200, the selected assistant gates, such as the assistant gate $AG_1$ and the assistant gate $AG_2$, are biased to a voltage $V_i$ that is sufficient to induce corresponding inversion regions 140 in the substrate 10. The induced inversion regions 140, which act as conductive buried bit lines for the memory array, or source/drain regions for the memory cell 200, are electrically connected to the heavily doped pickup well 500, thereby providing the induced inversion region 140 with a bit line voltage $V_{BL}$. The bit line voltage $V_{BL}$ and the voltage $V_i$ may be provided via the contact structures 501 and 502 as shown in FIG. 5. A suitable word line voltage $V_{WL}$ is provided to the word line $WL_0$ that control the channel region 120 of the memory cell 200.

Those skilled in the art will readily observe that numerous modification and alterations of the present invention may be made while retaining the teachings of the invention. Accordingly, the above disclosure should be construed as limited only by the metes and bounds of the appended claims.

What is claimed is:

1. An electrically programmable nonvolatile memory array, comprising:

a semiconductor substrate of first conductivity type;

columns of spaced apart source/drain (S/D) regions defined on said semiconductor substrate;

a channel region between said source/drain (S/D) regions;

a first dielectric layer disposed on said source/drain (S/D) regions;

columns of assistant gates stacked on said first dielectric layer, wherein each of said assistant gates has a top surface and sidewalls, wherein at least one end of each said columns of assistant gates partially overlaps with a doped pickup well formed in said semiconductor substrate, and wherein a bit line voltage is provided to said doped pickup well;

a second dielectric layer comprising a charge-trapping layer uniformly disposed on said top surface and sidewalls of said assistant gate and disposed on said channel region, wherein said second dielectric layer produces a recessed trough between said source/drain (S/D) regions; and rows of word lines laid on said second dielectric layer, said rows of word lines intersecting said columns of assistant gates;

wherein, when programming a memory cell defined by a specific row of said word lines of said electrically programmable non-volatile memory array, only two columns of said assistants gates next to said memory cell are biased to a voltage $V_i$ that is sufficient to correspondingly induced two columns of inversion regions of second conductivity type in said semiconductor substrate; and wherein said inversion regions of second conductivity type function as a source/drain of said memory cell.

2. The electrically programmable non-volatile memory array according to claim 1 wherein said first dielectric layer is made of silicon dioxide.

3. The electrically programmable non-volatile memory array according to claim 2 wherein said silicon dioxide is thermally grown.

4. The electrically programmable non-volatile memory array according to claim 1 wherein said second dielectric layer is a tri-layer dielectric.

5. The electrically programmable non-volatile memory array according to claim 1 wherein said second dielectric layer is an ONO tri-layer, and said charge-trapping layer is a silicon nitride layer sandwiched between a bottom oxide layer and a top oxide layer.

6. The electrically programmable non-volatile memory array according to claim 1 wherein said second dielectric layer is a bi-layer dielectric.

7. The electrically programmable non-volatile memory array according to claim 1 wherein said assistant gate is made of polysilicon.

8. The electrically programmable non-volatile memory array according to claim 1 wherein said word line comprises polysilicon.

9. The electrically programmable non-volatile memory array according to claim 1 wherein said word line is metal word line.

* * * * *